United States Patent
Okamoto et al.

(10) Patent No.: US 9,824,868 B2
(45) Date of Patent: Nov. 21, 2017

(54) SPUTTERING TARGET AND METHOD FOR PRODUCING THE SAME

(71) Applicant: Ferrotec Ceramics Corporation, Tokyo (JP)

(72) Inventors: Ken Okamoto, Tokyo (JP); Tadahisa Arahori, Tokyo (JP); Akishige Sato, Tokyo (JP); Sachio Miyashita, Tokyo (JP); Eiji Kusano, Ishikawa (JP); Muneaki Sakamoto, Ishikawa (JP)

(73) Assignee: Ferrotec Ceramics Corporation, Tokyo (JP)

( * ) Notice: Subject to any disclaimer, the term of this patent is extended or adjusted under 35 U.S.C. 154(b) by 367 days.

(21) Appl. No.: 14/355,988

(22) PCT Filed: Oct. 25, 2012

(86) PCT No.: PCT/JP2012/077566
§ 371 (c)(1),
(2) Date: May 2, 2014

(87) PCT Pub. No.: WO2013/065564
PCT Pub. Date: May 10, 2013

(65) Prior Publication Data
US 2014/0318956 A1    Oct. 30, 2014

(30) Foreign Application Priority Data
Nov. 4, 2011   (JP) .................. 2011-242573

(51) Int. Cl.
| C23C 14/00 | (2006.01) |
| H01J 37/34 | (2006.01) |
| C04B 35/053 | (2006.01) |
| C23C 14/08 | (2006.01) |
| C23C 14/34 | (2006.01) |
| C04B 35/645 | (2006.01) |

(52) U.S. Cl.
CPC ........ *H01J 37/3426* (2013.01); *C04B 35/053* (2013.01); *C04B 35/645* (2013.01); *C23C 14/081* (2013.01); *C23C 14/3414* (2013.01); *C04B 2235/662* (2013.01); *C04B 2235/663* (2013.01); *C04B 2235/72* (2013.01); *C04B 2235/724* (2013.01); *C04B 2235/725* (2013.01); *C04B 2235/77* (2013.01); *C04B 2235/785* (2013.01); *C04B 2235/786* (2013.01); *C04B 2235/787* (2013.01)

(58) Field of Classification Search
CPC ..................................... C23C 14/081
See application file for complete search history.

(56) References Cited

U.S. PATENT DOCUMENTS

2010/0294657 A1* 11/2010 Nagano ................. C04B 35/043
                                                                    204/298.13

FOREIGN PATENT DOCUMENTS

| CN | 1964932 | 5/2007 |
| CN | 101925555 | 12/2010 |
| CN | 102086504 | 6/2011 |
| JP | 10-130828 | 5/1998 |
| JP | 10-158826 | 6/1998 |
| JP | 10-297955 | 11/1998 |
| JP | 11-029857 | 2/1999 |
| JP | 11-139862 | 5/1999 |
| JP | 2000-169956 | 6/2000 |
| JP | 2004-084018 | 3/2004 |
| JP | 2006-069811 | 3/2006 |
| JP | 2006-207014 | 8/2006 |
| JP | 2007-138198 | 6/2007 |
| JP | 2008-189493 | 8/2008 |
| JP | 2008-285371 | 11/2008 |
| JP | 2009-173502 | 8/2009 |
| TW | 200948743 | 12/2009 |
| WO | 2011/040028 | 4/2011 |

OTHER PUBLICATIONS

U.S. Appl. No. 14/355,959, filed May 2, 2014, Okamoto et al.
Itani, Journal of the Society of Inorganic Materials, 2009, vol. 16, pp. 361-371, English translation of the Japanese office action as a concise explanation.

* cited by examiner

*Primary Examiner* — Timon Wanga
(74) *Attorney, Agent, or Firm* — Clark & Brody

(57) ABSTRACT

A sputtering target which is made of a magnesium oxide sintered body having a purity of not less than 99.99% or not less than 99.995% by mass %, a relative density of not less than 98%, and an average grain size of not more than 8 μm. The average grain size of the sputtering target is preferably not more than 5 μm, more preferably not more than 2 μm. A sputtered film having an excellent insulation resistance and an excellent homogeneity can be obtained by using the sputtering target.

7 Claims, No Drawings

SPUTTERING TARGET AND METHOD FOR PRODUCING THE SAME

TECHNICAL FIELD

The present invention relates to a sputtering target and a method for producing the same.

BACKGROUND ART

Sputtering is a method of depositing a film on a substrate by accelerating ions typically by means of glow discharge so as to hit a sputtering target so that the target ejects a film material due to the kinetic energy of the ions. It is widely used as a tool for fabricating structures such as thin film devices in the areas of semiconductors, liquid crystals, solar cells, and so on. Among others, a target using a magnesium oxide sintered body (hereinafter, also referred to as a "magnesium oxide target," a "magnesia target," and an "MgO target") is used as a film material for a tunnel barrier layer of a tunnel magneto-resistive element (TMR element) used for magnetic heads of hard disks, high performance non-volatile memories, and the like, and also as a source of film materials in the applications of forming a protective film or an insulating film in a plasma display panel (PDP).

A TMR element, which is an element for detecting changes in external magnetic force by exploiting the tunnel magneto-resistance effect, has an extremely thin insulator layer (tunnel barrier layer) of not more than a few nanometers sandwiched by electric conductors (electrodes). It is generally understood that a TMR element having a higher electrical resistance change rate (an MR ratio) can detect magnetic force changes at a higher sensitivity, thus exhibiting higher performance, and as a tunnel barrier layer material, magnesium oxide is expected to be particularly promising.

Since a magnesium oxide target is usually an insulating material, a high-frequency sputtering apparatus is used for forming a magnesium oxide sputtered film. In this apparatus, a magnesium oxide target is joined to an electrode, a substrate is disposed at a counter electrode of the electrode, and a sputtering discharge is carried out in an atmosphere such as argon under a reduced pressure, thereby depositing a film on the substrate.

Patent Document 1 discloses an invention relating to "a magnesium oxide sintered body sputtering target, which has a sintered density close to the theoretical density, and therefore releases a reduced amount of gas, and which has a crystal orientation in the (111) plane orientation, and thereby enhances secondary electron emission during sputtering." It is suggested that the magnesium oxide sintered body sputtering target of Patent Document 1 is made up of a sintered body in which a large proportion of crystals have the (111) plane orientation in the plane to which a uniaxial pressure is applied, and that the secondary electron emission during sputtering is enhanced and thereby the sputtering efficiency is improved. Further, in embodiments thereof, it is described that the average grain size is about 10 μm in any case.

Patent Document 2 discloses that, by preparing a magnesium-oxide sputtering target having a purity of not less than 99.50% and less than 99.99%, and a relative density of 97.5% to 99.5%, the vapor deposition rate of the magnesium-oxide sputtering target may be improved. Also reported in a comparative example thereof is a case of a 99.99% sintered body which is fired at 1650° C. in an atmospheric furnace.

Patent Document 3 proposes a method of efficient aqueous granulation of magnesium oxide powder, in which cubic-shaped magnesium oxide having a purity of 99.985% and a specific surface area of 7.5 $m^2/g$, which is obtained by a gas-phase oxidation reaction process, is granulated and formed by using polyethylene glycol and ammonium polycarboxylate, and fired at 1650° C. in an electric furnace to obtain a sintered body of a relative density of 96.1%.

CITATION LIST

Patent Documents

[Patent Document 1] JP2009-173502A
[Patent Document 2] JP2007-138198A
[Patent Document 3] JP2004-84018A

SUMMARY OF INVENTION

Technical Problem

Although Patent Document 1 discloses a crystal structure of a sintered body to improve sputtering efficiency, the performance of a sputtered film to be formed is not verified. For example, in a use such as a tunnel barrier layer of a TMR element and the like, since the layer is an ultrathin film, it is more important that the film material to be formed itself has a high dielectric breakdown voltage and a high reliability, and the sputtered film has a homogeneous thickness distribution and film quality, than the efficiency of the sputtering.

Patent Document 2 also merely proposes a material for which an emphasis is placed on the efficiency of sputtering, and it has not examined the performance of the formed film material. Moreover, although it is suggested in this invention that the purity is preferably not more than 99.99%, it is not possible with such a low purity sintered body to achieve a high dielectric breakdown voltage and homogeneity of the sputtered film. Incidentally, although among the comparative examples, there is one having a purity of 99.99%, the relative density thereof remains in a range of 97.8 to 98.0%, and thus it is not possible to improve the dielectric breakdown voltage and the homogeneity of the sputtered film by this sintered body.

Although the granulation process is improved in Patent Document 3, the relative density of the finally obtained sintered body remains not more than 96.1%.

It is an object of the present invention to provide a sputtering target which enables the formation of a magnesium oxide insulating layer which has both a high insulation resistance and homogeneity, and a method for producing the same.

Solution to Problem

In order to solve the above described problems, the present inventors have diligently studied the physical properties of a magnesium oxide thin film to be used as an insulating layer of various devices, in particular, excellent insulation resistance and homogeneity of a sputtered film formed by sputtering using a concerned target. As a result, the present inventors have found out that a further purification of the magnesium oxide sintered body which is a raw material of the target is required, and the purity needs to be not less than 99.99% (4N), even not less than 99.995% (4N5), further preferably not less than 99.999% (5N), and that it is effective to improve the relative density of a high purity magnesium oxide sintered body and to refine the crystal grain size, eventually completing the present invention.

The gist of the present invention is sputtering targets of items (1) to (8) described below, and methods for producing the sputtering targets according to items (9) to (12) described below.

(1) A sputtering target made of a magnesium oxide sintered body which has a purity of not less than 99.99% by mass %, a relative density of more than 98%, and an average grain size of not more than 8 μm.

(2) The sputtering target according to item (1), in which the magnesium oxide sintered body has a purity of not less than 99.995% by mass %.

(3) The sputtering target according to item (1), in which the magnesium oxide sintered body has a purity of not less than 99.999% by mass %.

(4) The sputtering target according to any one of items (1) to (3), in which the average grain size is not more than 5 μm.

(5) The sputtering target according to any one of items (1) to (3), in which the average grain size is not more than 2 μm.

(6) The sputtering target according to any one of items (1) to (3), in which the average grain size is not more than 1 μm.

(7) The sputtering target according to any one of items (1) to (6), in which a peak intensity ratio I(111)/I(200) by X-ray diffraction is not less than 8% and less than 25%.

(8) The sputtering target according to item (7), in which the sputtering target is ground such that a surface in which a peak intensity ratio I(111)/I(200) by X-ray diffraction is not less than 8% and less than 25% is an erosion surface during sputtering.

(9) A method for producing a sputtering target made of a magnesium oxide sintered body having a purity of not less than 99.99% by mass %, comprising: performing a hot-press sintering at 1250 to 1350° C. to obtain the sintered body; and thereafter performing an annealing treatment at 1250 to 1400° C. in an atmosphere.

(10) The method for producing a sputtering target according to item (9), comprising: performing the hot-press sintering at 1250 to 1350° C., thereafter performing the annealing treatment at 1250 to 1400° C. in the atmosphere to obtain the sintered body in which a peak intensity ratio I(111)/I(200) by X-ray diffraction of a hot pressed surface is not less than 8% and less than 25%, and thereafter performing a grinding such that the hot pressed surface becomes an erosion surface during sputtering.

(11) A method for producing a sputtering target made of a magnesium oxide sintered body having a purity of not less than 99.99% by mass %, comprising: performing a hot-press sintering at 1250 to 1350° C. to obtain the sintered body, and thereafter performing an annealing treatment at 1000 to 1250° C. for not less than 10 hours in an atmosphere.

(12) The method for producing a sputtering target according to item (11), comprising: performing the hot-press sintering at 1250 to 1350° C., thereafter performing the annealing treatment at 1000 to 1250° C. for not less than 10 hours in the atmosphere to obtain the sintered body in which a peak intensity ratio I(111)/I(200) by X-ray diffraction of a hot pressed surface is not less than 8% and less than 25%, and thereafter performing a grinding such that the hot pressed surface becomes an erosion surface during sputtering.

Advantageous Effects of Invention

The sputtering target of the present invention allows a sputtered film, which is formed by sputtering using the concerned target, to have an excellent insulation resistance, a small surface roughness, and an excellent homogeneity. Such a sputtered film having an excellent insulation resistance and an excellent homogeneity will provide a film that has stable electrical properties and permittivity even in an ultrathin film, thereby contributing to, for example, improving the performance of a TMR element.

DESCRIPTION OF EMBODIMENTS

1. Purity of Magnesium Oxide Sintered Body

In a sputtering target relating to the present invention, a magnesium oxide sintered body having a purity of not less than 99.99% (4N) by mass % needs to be used. With a magnesium oxide sintered body having a purity of not less than 99.9% (3N), it is not possible to impart an excellent dielectric breakdown voltage and good surface roughness to a sputtered film which is obtained by using the concerned sintered body as the target even if various countermeasures such as performing a hot-press sintering and an annealing treatment as described below are taken. In contrast to this, with a sintered body obtained by using a magnesium oxide raw material having a purity of not less than 99.99% (4N) and whose relative density and average grain size are appropriately controlled, it is possible to impart an excellent dielectric breakdown voltage and good surface roughness (homogeneity) to the sputtered film which is obtained by using the concerned sintered body as the sputtering target. In particular, it is preferable that the sintered body does not contain alkali metals and halogens.

In a sputtering target relating to the present invention, it is also possible to use a magnesium oxide sintered body having a purity of, by mass %, not less than 99.995% (4N5), more preferably not less than 99.999% (5N). The higher the purity of the magnesium oxide sintered body to be used is, the higher the dielectric breakdown voltage of the sputtered film to be obtained will be.

While a magnesium oxide sintered body is obtained by firing a raw material powder having a level of purity equal to a targeted purity, since it is difficult to obtain a sufficiently dense sintered body by a pressureless sintering in an ordinary atmospheric furnace, a hot-press sintering to be described later is preferably performed.

2. Relative Density

When the relative density (a value in percentage of a measured density divided by a theoretical density) of a sputtering target is low, the surface roughness of the sputtered film, which is to be obtained by sputtering using the concerned target, increases, thereby adversely affecting the homogenization of the thin film. Further, the number of pores in the base material increases, and a small amount of moisture is adsorbed in the base material so that water is released during the sputtering process, adversely affecting the property of the sputtered film. Therefore, the level of relative density is preferably more than 98%, and particularly preferably not less than 99%.

3. Average Grain Size

When the average grain size of a sputtering target is large, the surface roughness of the sputtered film, which is to be obtained by sputtering using the concerned target, increases, thereby adversely affecting the homogenization of the thin film. Therefore, the average grain size is preferably as small as possible, and in particular needs to be not more than 8 μm. The average grain size is more preferably not more than 5 μm, and further preferably not more than 2 μm.

It is noted that, according to the study by the present inventors, raising the purity of the sputtering target from 3N to 4N, 5N will have positive effects on the physical properties of the sputtered film.

4. Crystal Orientation

In the case of magnesium oxide, the crystal orientation in the (111) plane orientation is enhanced, which is a causing factor of manifestation of anisotropy. With a sputtering target in which the crystal orientation in the (111) plane orientation is enhanced, it becomes difficult to obtain a sputtered film having a homogeneous thickness distribution. Quantitative comparison of the degree of crystal orientation in the (111) plane orientation can be done by taking a ratio of a peak intensity by X-ray diffraction in the (111) plane orientation with respect to that in the (200) plane orientation, which shows a highest peak of magnesium oxide, and it is preferable that the I(111)/I(200) ratio is not less than 8% and not more than 25%. When the ratio exceeds 25%, it becomes difficult to achieve a film thickness homogeneity of the sputtered film. On the other hand, when the ratio becomes less than 8%, the crystals in the (200) plane orientation become overgrown, and the dielectric breakdown voltage and the film quality homogeneity of the sputtered film will be impaired. Thus, it is preferable that the lower limit of the I(111)/I(200) ratio is 8% and the upper limit thereof is 25%.

5. Method for Producing Sputtering Target

Concerning a method for producing a sputtering target relating to the present invention, sintering may be performed in an atmospheric furnace. However, in a pressureless sintering, crystal grain growth tends to take place in a dense sintered body having a relative density of not less than 98%, particularly in a high purity raw material having a purity of not less than 4N, and therefore it is difficult to obtain a sintered body having an average grain size of not more than 8 μm.

Accordingly, the sputtering target relating to the present invention is preferably produced by a hot pressing method in which magnesium oxide powder is sintered under pressure. Although an HIP method is known as means of densifying a pressureless sintered body afterward, since the material is prone to undergo crystal grain growth, the crystal grains overgrow during the HIP processing, making it difficult to restrict the average grain size to not more than 8 μm.

The sintered body can be produced by performing a hot-press sintering at 1250 to 1350° C., and thereafter performing an annealing treatment at 1000 to 1400° C. in the atmosphere. When a hot-press sintering is used, it is general that powder raw material having a purity equivalent to that of the sintered body of interest is charged into a mold made of carbon, and is subjected to uniaxial pressure sintering in vacuum or in a non-oxidizing atmosphere such as nitrogen and argon.

When the temperature of the hot-press sintering is less than 1250° C., the density of the sintered body cannot be secured sufficiently, thereby leading to deterioration of the homogeneity and dielectric breakdown voltage of the sputtered film. On the other hand, when the temperature exceeds 1350° C., although it is possible to obtain a sintered body having a density close to a theoretical density, crystal grain growth progresses during sintering, making it difficult to restrict the average grain size to not more than 8 μm. Moreover, as the sintering temperature increases, the more oxygen defects occur in the sintered boy, the coloration of the sintered body changes from white to gray to black. When such a sintered body which lacks oxygen is used for the sputtering target, the sputtered film will lack oxygen as well, leading to deterioration of film physical properties such as dielectric breakdown voltage, etc. However, the oxygen defects of a hot-press sintered body can be removed afterwards by performing annealing in an environment containing oxygen. As such annealing, for example, a heat treatment at 1000 to 1400° C. is preferably performed in an ordinary atmospheric furnace.

On the other hand, in sputtering, it is also possible to supplement oxygen, which is deficient in the target material, during film deposition by adding oxygen to the process gas. However, while oxygen atoms originating from the target reaches a very high temperature range of more than 10000K at the instance of sputtering, the oxygen atoms that are supplied from the outside as the process gas are at low temperature, and therefore are less likely to be taken into the sputtered film. Consequently, the film quality is unstabilized such as by microdefects (vacancies) being confined in the sputtered film, and there may be a case in which the dielectric breakdown voltage is extremely deteriorated. In addition, in a sputtering added with oxygen, it is necessary to reduce the deposition rate, thus adversely affecting the yield, and involving the aging of the film quality. Therefore, a target containing oxygen defects is not suitable for the formation of an insulating film which is ultrathin and reliable.

The hot-press sintering is preferably performed, for example, for a range of 30 to 600 minutes. When the press time is less than 30 minutes, heat transfer and sintering will not reach a stable state, and overall densification becomes insufficient, or only the outer periphery is densified resulting in accumulation of residual stress so that the target base material may be broken by the impact of sputtering. On the other hand, when the press time exceeds 600 minutes, the crystal grain growth and oxygen defects of the sintered body increase, and when this sintered body is used as the target material, it is difficult to obtain a high quality sputtered film.

The pressure of the hot-press sintering is preferably not less than 5 MPa. When the pressure is less than 5 MPa, pressurizing force becomes insufficient, thus causing occurrence of a density decrease and a local density unevenness in the base material. There is no particular restriction on the upper limit of the pressure within a range the plant capacity allows.

When an atmospheric annealing treatment is not performed, or when the temperature thereof is less than 1000° C. even if it is performed after hot-press sintering, because the density cannot be improved and oxygen defects in the sintered body cannot be removed to a sufficient level, the quality of the sputtered film will deteriorate as described above. On the other hand, when the annealing temperature exceeds 1400° C., crystal grain growth becomes excessive, thereby deteriorating the homogeneity of the sputtered film thickness. Further, when non-homogeneous coarse grains are present in the target, large grains may fall off into the processing chamber as a foreign matter with the progress of sputtering. If the falling off takes place and the surface of the target is roughened, the homogeneity of the sputtered film may be deteriorated.

The atmospheric annealing treatment is preferably performed for a range of 30 to 600 minutes if it is performed at a temperature not less than 1250° C. When the annealing time is less than 30 minutes, the entire material will not reach a targeted density and grain size, causing variation of physical properties in the same base material. On the other hand, when the annealing time exceeds 600 minutes, a problem may occur in that non-homogeneous coarse grains take place due to excessive grain growth, thereby leading to deterioration of the sputtered film quality.

The atmospheric annealing treatment is preferably held for not less than 600 minutes if it is performed at a temperature of less than 1250° C. By such a prolonged holding make it possible, as with the case of performing at a temperature of not less than 1250° C., to improve the density and remove oxygen defects. In this case, since almost no crystal grain growth is accompanied, it is possible to obtain a more excellent sputtered film. It is noted that the holding time when the atmospheric annealing treatment is performed at a temperature of less than 1250° C. is preferably 5760 minutes at its upper limit since even if the treatment is performed for excessively long hours, the effect thereof will only be saturated.

In particular, by adjusting the relative density of the sintered body to be 90 to 98% at the above described hot-press conditions, and by proceeding with a sintering process in an atmospheric annealing process to make the relative density to be in a range exceeding 98%, or preferably not less than 99%, it becomes possible to proceed with the removal of oxygen defects and the control of the density and the grain size at the same time. Thus obtained sputtering target will be one having a high density and fine crystal grains, and containing almost no oxygen defect. Further, the removal of oxygen defects can be confirmed by whitening of the sintered body.

In sintering by use of hot-press, the material is likely to have anisotropy since sintering and crystal growth progress in a uniaxially pressurized state. As mentioned above, in magnesium oxide in which the crystal orientation in the (111) plane orientation is enhanced, it becomes difficult to obtain a sputtered film having a homogeneous thickness distribution. Therefore, hot-press sintering is preferably performed such that the peak intensity ratio I(111)/I(200) by X-ray diffraction of the hot pressed surface is not less than 8% and less than 25%. Here, for example, when hot-press is performed at a relatively high temperature, the I(111)/I(200) ratio of the obtained sintered body may exceed 25%. Moreover, for example, in the case of a sintered body which has undergone grain growth to a level of an average grain size of not less than several tens μm, the I(111)/I(200) ratio may become less than. Examples of the case in which grain growth occurs to a level of an average grain size of not less than several tens μm include a case in which atmospheric firing (pressureless firing) is performed at a relatively high temperature condition.

It is noted that normal atmospheric sintering (pressureless sintering) makes it possible to easily obtain a material having an isotropic crystal state, but on the other hand, a pressureless sintered body, which is prepared in a state that grain growth is suppressed, exhibits insufficient densification, and is porous so that there is a problem of gas generation during sputtering, and it is difficult to obtain a good sputtered film.

Machining of a sintered body is preferably performed by wet grinding using a grinding stone including typical diamond abrasive grains Polishing process such as lapping and/or surface roughening process such as sand blasting may be added as desired. Since an outermost layer portion of a sintered body is prone to be contaminated by impurity elements originated from firing furnace materials etc., the entire surface thereof is preferably ground to be removed. It is noted that after a grinding process, it is effective to sufficiently remove grinding liquid and grinding chips, which adhere onto the outer layer, by using a method such as chemical cleaning, pure water ultrasonic cleaning, and the like.

Example 1

In order to confirm advantageous effects of the present invention, magnesium oxide sintered bodies having purities shown in Table 1 were prepared, and targets (discs having a diameter of 75 mm and a thickness of 5 mm) were produced at various production conditions shown in Table 1. Various performances were investigated on those targets. Measurement methods for the various performances are shown below.

<Relative Density of Sintered Body>

Apparent densities were measured by an Archimedes method conforming to JIS R 1634, and supposing the theoretical density of magnesium oxide to be 3.58 g/cm$^3$, relative densities (%) with respect to this value were determined.

<Average Grain Size of Sintered Body>

A test specimen, which was mirror polished to a surface roughness of less than Ra: 0.05 μm, was cut out from an inner layer portion of each sintered body, and was subjected to a heat etching treatment at 1200° C. such that crystal grains were exposed. Thereafter, photographs of crystal grains were taken with a scanning electron microscope (SEM) and thereafter, conforming to JIS R 1670, an average grain size (μm) was calculated by drawing an equivalent circle for each grain in any visual field in which N=100 was secured, and tallying grain sizes.

<Crystal Orientation of Sintered Body>

A rectangular specimen was cut out by grinding from an inner layer of the material such that a hot pressed surface of the magnesium oxide sintering and a surface normal thereto was able to be analyzed. Analyses were conducted with an X-ray diffraction apparatus having a Cu—Kα ray source in such a way that the crystal orientations are compared between the hot pressed surface and the surface normal thereto in the same material. In common with all the analysis specimens and analysis directions, a (200) plane peak was detected at around 43.0° in 2θ as a highest first peak, a (220) plane peak was detected at around 62.4° in 2θ as a second peak, and a (111) plane peak was detected at around 37.0° in 2θ as a third peak. Therefore, in order to verify the crystal orientation caused by hot pressing, an intensity ratio (%) of (111) plane with respect to (200) plane which exhibits a highest peak was calculated as shown by the following expression:

$$I(111)/I(200) \tag{1}$$

where, the meaning of each symbol in Expression (1) is as follows:

I(111): Peak height (cps) of (111) plane of X-ray spectrum; and

I(200): Peak height (cps) of (200) plane of X-ray spectrum.

<Purity of Sintered Body>

A sintered body was subjected to a pre-processing such as alkali fusion to form a solution, and quantitative analysis of 17 elements including Al, Si, Fe, Cu, Ca, Cr, Ti, Ni, Mo, W, Co, Y, Zn, Mn, Li, Na, and K was conducted with an inductively coupled plasma atomic emission spectrometry (ICP-AES) and a flame spectrophotometer (targeted for Li, Na, and K). Thereafter, quantitative values of the detected elements were converted into those of oxide, and a purity of a magnesium oxide sintered body was determined by subtracting the quantitative values of the oxide from 100%.

It is noted that among the determined purities of the sintered bodies, those of not less than 99.9% and less than 99.99% were referred to as 3N, those of not less than 99.99% and less than 99.995% as 4N, those of not less than 99.995% and less than 99.999% as 4N5, and those of not less than 99.999% as 5N.

<Surface Finish of Sputtering Target>

Centerline average roughness (Ra) of the ground surface of each target material, whose erosion surface was subjected to finish processing by using a #400 grinding stone, was in a range: Ra=0.2 to 0.8 μm.

An experiment was conducted such that the above described various targets were mounted in a chamber of a load lock type ultra-high vacuum high-frequency sputtering apparatus, and a film was deposited to measure and evaluate physical properties of the obtained sputtered film. The results are shown in Table 1.

It is noted that film formation was conducted by using 99.9995% Ar gas as the discharge gas, with a flow rate of 10 sccm, and a discharge voltage of 0.4 Pa. The achieved pressure during film forming was $2.0 \times 10^{-4}$ Pa. The input power was 150 W. A 50 mm square borosilicate glass and a glass with a doped indium tin oxide (ITO) film having silver electrodes with a width of 5 mm on opposite ends of the upper surface of the ITO were used as the substrates, and a magnesium oxide sputtered film was deposited thereon in a film thickness of 400 nm. In a measurement sample for dielectric breakdown voltage, Cu electrodes each having a diameter of 3 mm and a film thickness of 100 nm were formed at 9 positions by sputtering on the magnesium oxide sputtered film. It is noted that the below described measurements were conducted on thin films which were deposited after the target input power reached 4.5 kWh.

<Surface Roughness of Sputtered Film>

The surface roughness Ra (nm) of a sputtered film was measured by a scanning probe microscope (AFM) under the conditions: an excitation voltage of 1.36V, a scanning range of 1000 nm, a lever length of 125 μm, and a needle height of 10 μm.

<Dielectric Breakdown Voltage of Sputtered Film>

An electrochemical analyzer was used to measure dielectric breakdown voltage values of a sputtered film at 9 positions where the Cu top electrodes were provided, under the conditions of a measurement potential of 0 to 5V, and a scanning rate of 0.01 V/s, and an average value for the 9 positions was determined as a dielectric breakdown voltage of the sputtered film.

As shown in Table 1, No. 1 showed a relative density of as low as 93.5% as a result of being sintered in an atmospheric furnace, and also poor results in both the dielectric breakdown voltage and the homogeneity of the sputtered film. Since the hot-press temperature was low, No. 2 showed a relative density of as low as 85.5% even though atmospheric annealing was conducted thereafter, and also poor results in both the dielectric breakdown voltage and the homogeneity of the sputtered film. No. 3, which was an example in which hot pressing was conducted at an appropriate temperature, but atmospheric annealing was not conducted thereafter, showed a relative density of as low as 97.4%, and also poor results in both the dielectric breakdown voltage and the homogeneity of the sputtered film because of a condition in which oxygen defects remain.

No. 4, for which the hot-press temperature was as high as 1400° C., showed an average grain size of the sintered body of as high as 12.8 μm and a "I(111)/I(200)" ratio of as high as 49.1% in the hot-press plane. As a result, both the dielectric breakdown voltage and the homogeneity of the sputtered film were poor. No. 7, for which the temperature of atmospheric annealing after hot pressing was as high as 1450° C. and the crystal grain growth excessively progressed, showed an average grain size of 13.5 μm, and a "I(111)/I(200)" ratio of as low as 7.5% in the hot-press plane. As a result, both the dielectric breakdown voltage and the homogeneity of the sputtered film were poor. Although No. 11 satisfied the conditions specified in the present invention in the production conditions and the relative density and the average grain size of the sintered body, the dielectric breakdown voltage of the sputtered film was poor because of a low purity of 99.91%.

In contrast to that, since Nos. 5, 6, 8, 9, 10, 12, 13 and 14 all satisfied the conditions specified by the present invention, they showed good results both in the dielectric breakdown voltage and the homogeneity of the sputtered film. Particularly, any of Nos. 12 to 14 was an example in which annealing was conducted at a low temperature for long hours. In Nos. 12 and 13, since the density increased and the removal of oxygen defects progressed while the crystal grain growth was suppressed, film properties were significantly

TABLE 1

| | Production method | | | | | | | Evaluation | | | | | |
| | | | | | | | | Sintered body | | | | Sputtered film | |
| | Sintering | | Annealing | | | | | | | I(111)/I(200) | | | |
| No. | Method | Temperature (° C.) | Time (min) | Temperature (° C.) | Time (min) | Purity (%) | Classification | Coloration | Relative density (%) | Average grain size (nm) | Pressed surface (%) | Normal surface (%) | Dielectric breakdown voltage (MV/m) | Ra (nm) |
|---|---|---|---|---|---|---|---|---|---|---|---|---|---|---|
| 1 | Atmospheric furnace | 1550 | 120 | Without | — | 99.993 | 4N | White | 93.5 | 6.5 | — | — | 0.5 | 0.95 |
| 2 | Hot-press | 1230 | 120 | 1350 | 120 | 99.993 | 4N | White | 85.5 | 0.9 | 12.9 | 15.1 | 1.6 | 0.88 |
| 3 | Hot-press | 1280 | 120 | Without | — | 99.996 | 4N5 | Gray | 97.4 | 0.8 | 12.1 | 10.0 | 1.3 | 1.02 |
| 4 | Hot-press | 1400 | 120 | 1400 | 120 | 99.996 | 4N5 | White | 99.8 | 12.8 | 49.1 | 21.5 | 1.9 | 1.23 |
| 5 | Hot-press | 1280 | 120 | 1300 | 120 | 99.993 | 4N | White | 98.6 | 1.5 | 12.2 | 17.0 | 7.5 | 0.12 |
| 6 | Hot-press | 1280 | 120 | 1300 | 120 | 99.999 | 5N | White | 99.0 | 1.9 | 13.5 | 17.6 | 9.1 | 0.18 |
| 7 | Hot-press | 1280 | 120 | 1450 | 120 | 99.996 | 4N5 | White | 99.5 | 13.5 | 7.5 | 25.5 | 1.5 | 0.85 |
| 8 | Hot-press | 1280 | 120 | 1350 | 120 | 99.993 | 4N | White | 99.2 | 4.5 | 17.7 | 18.7 | 7.8 | 0.25 |
| 9 | Hot-press | 1280 | 120 | 1350 | 120 | 99.996 | 4N5 | White | 99.3 | 7.1 | 18.8 | 19.5 | 8.8 | 0.26 |
| 10 | Hot-press | 1280 | 120 | 1350 | 120 | 99.999 | 5N | White | 99.3 | 7.5 | 20.0 | 20.1 | 9.8 | 0.29 |
| 11 | Hot-press | 1280 | 120 | 1350 | 120 | 99.910 | 3N | White | 98.2 | 4.2 | 8.5 | 9.5 | 1.3 | 0.45 |
| 12 | Hot-press | 1280 | 120 | 1100 | 1440 | 99.996 | 4N5 | White | 99.3 | 0.9 | 12.7 | 10.3 | 16.2 | 0.11 |
| 13 | Hot-press | 1280 | 120 | 1000 | 2880 | 99.996 | 4N5 | White | 99.2 | 0.9 | 12.4 | 10.2 | 14.8 | 0.12 |
| 14 | Hot-press | 1280 | 120 | 950 | 2880 | 99.996 | 4N5 | Gray | 98.5 | 0.8 | 12.1 | 10.0 | 2.5 | 1.05 | improved. In No. 14, the annealing temperature was as low as 950° C., and removal of oxygen defects could not be done as much as in Nos. 12 and 13.

INDUSTRIAL APPLICABILITY

A sputtering target of the present invention can allow the sputtered film which is formed by sputtering using the concerned target to have an excellent insulation resistance, a small surface roughness, and an excellent homogeneity. Such a sputtered film having an excellent insulation resistance and an excellent homogeneity provides a film having stable electrical properties and a permittivity even in a ultrathin film and, for example, contributes to performance improvement of a TMR element.

The invention claimed is:

1. A sputtering target made of a magnesium oxide sintered body which has a purity of not less than 99.99% by mass %, a relative density of more than 98%, an average grain size of not more than 8 μm, and a peak intensity ratio I(111)/I(200) by X-ray diffraction is not less than 8% and less than 25%.

2. The sputtering target according to claim 1, wherein the magnesium oxide sintered body has a purity of not less than 99.995% by mass %.

3. The sputtering target according to claim 1, wherein the magnesium oxide sintered body has a purity of not less than 99.999% by mass %.

4. The sputtering target according to claim 1, wherein the average grain size is not more than 5 μm.

5. The sputtering target according to claim 1, wherein the average grain size is not more than 2 μm.

6. The sputtering target according to claim 1, wherein the average grain size is not more than 1 μm.

7. The sputtering target according to claim 1, wherein the sputtering target is ground such that a surface in which the peak intensity ratio I(111)/I(200) by X-ray diffraction is not less than 8% and less than 25% is an erosion surface during sputtering.

* * * * *